United States Patent [19]

Parker et al.

[11] Patent Number: 4,818,872
[45] Date of Patent: Apr. 4, 1989

[54] INTEGRATED CHARGE NEUTRALIZATION AND IMAGING SYSTEM

[75] Inventors: Norman W. Parker, Westlake Village; William G. Turnbull; William P. Robinson, both of Newbury Park, all of Calif.

[73] Assignee: Microbeam Inc., Newbury Park, Calif.

[21] Appl. No.: 49,736

[22] Filed: May 11, 1987

[51] Int. Cl.[4] .............................................. H01J 37/26
[52] U.S. Cl. ................................. 250/309; 250/396 R; 250/397; 250/306; 250/307; 250/281
[58] Field of Search ............... 250/309, 310, 306, 307, 250/396 R, 397, 281

[56] References Cited

U.S. PATENT DOCUMENTS

| | | | |
|---|---|---|---|
| 3,845,305 | 12/1974 | Liebl | 250/309 |
| 3,930,155 | 12/1975 | Kanomata et al. | 250/309 |
| 4,058,724 | 11/1977 | McKinney et al. | 250/309 |
| 4,296,323 | 10/1981 | Gerlach | 250/309 |
| 4,564,758 | 1/1986 | Slodzian et al. | 250/309 |
| 4,639,301 | 1/1987 | Doherty et al. | 250/398 |

Primary Examiner—Carolyn E. Fields
Assistant Examiner—John A. Miller
Attorney, Agent, or Firm—Lyon & Lyon

[57] ABSTRACT

An integrated charge neutralization and imaging system is disclosed. An energy analyzer is mounted directed above a target surface consisting of a 90 degree spherical electrostatic capacitor with variable voltage on both the inner and outer electrodes. Circular apertures are mounted at the entrance and exit of the analyzer to limit the fringing electric fields and define the beam size. An electrostatic lenses is used for focusing the beam from the electron gun into the virtual object plane of the energy analyzer. It is also used to collect secondary electrons or secondary ions leaving the energy analyzer and focused them into the imaging optics. A defector is used for steering the electron beam onto the axis of the lens. This deflector is also used to steer the secondary electrons or secondary ions into the electron/ion detector, or to steer the secondary ions into the SIMS mass filter entrance aperture. An electrons gun is used for providing a beam of electrons which is aimed towards the deflector, and then on through the lens and energy analyzer, finally ending up at the target surface. An imaging system employed by the present invention may include a channel electron multiplier or a secondary ion mass spectrometer system.

22 Claims, 4 Drawing Sheets

INTEGRATED CHARGE NEUTRALIZATION AND IMAGING SYSTEM

BACKGROUND OF THE INVENTION

1. Field Of The Invention

The present invention pertains to the field of focused ion beam systems. More particularly, the present invention pertains to focused ion beam systems having integrated charge neutralization features and imaging features.

2. The Prior Art

There are numerous focused ion beam applications in which it is required to image and process targets made from materials which are electrically non-conducting. These applications include imaging and processes on passivated integrated circuits, photoresist-covered wafers and masks, benchmarks, and microanalyses of insulators or insulating inclusions in conducting or non-conducting substrates.

One particular application of focused ion beams is repair of photomasks. In mask repair, the surface of the mask is generally a very poor electrical conductor. Because of this, the ion beam causes a buildup of charge on the mask material. Thus, for repair of masks using focused ion beams, it is essential that charging of the mask surface is reduced or eliminated during both the imaging and repair processes. It is highly desirable that this charge neutralization is highly effective since target charging may increase the spot size, deflect the beam, and change the imaging behavior. The effect on the imaging behavior arises because the trajectories of secondary electrons and secondary ions (which have initial energies below 100 eV) are greatly affected by relatively small voltage differences on the mask surface.

Representative of prior art mask repair systems is the KLA/Micrion 808, Seiko SIR1000, and Ion Beam Systems MicroTrim. In all of these systems, the electron flood gun for charge neutralization is not integrated with the secondary electron or secondary ion collectors used for imaging the mask or other insulating surface. The disadvantage of each of these systems is that the operation of the flood gun and the imaging system is not optimized because these separate functions are not part of an integrated system. In general, these functions will actually interfere with each other unless they are designed together into one integrated system.

Additional prior art exists in the field of microanalytical instrumentation, such as systems manufactured by Vacuum Generators (e.g., MIQ 156), Riber, and Cameca (IMS-3f, IMS-4f). A particularly relevant example consists of a modification of the Cameca ion microprobe (ref. Secondary Ion Mass Spectrometry V, SIMS V, ISBN 0-387-16263-1, 1986, pp. 158-160, "The Emission Objective Lens Working as an Electron Mirror: Self-Regulating Potential at the Surface of an Insulating Sample", G. Slodzian, M. Chaintreau, R. Dennebouy). In this modification of the Cameca instrument, the flood beam is integrated with the signal collection optics, but in an entirely different manner from the present invention. This article illustrates one method for electron beam charge neutralization, however, the implementation described by Slodzian, et al., is inapplicable for use in a focused ion beam instrument because the primary ion beam is not integrated with the signal collection optics.

SUMMARY OF THE INVENTION

The invention allows imaging non-conducting targets in a focused-ion-beam system, combining a charge neutralization electron gun with the imaging optics. The system has four possible operating modes: (1) charge neutralization of the target during or associated with secondary electron imaging, secondary ion imaging (all positive ion species), secondary ion mass spectrometer imaging (selected ion species), sputter etching, ion beam assisted deposition from a gas, deposition directly from the ion beam; (2) secondary electron imaging; (3) secondary ion imaging; and (4) secondary ion mass spectrometer (SIMS) imaging.

There are five major components included in the present invention. First, an energy analyzer is mounted directly above the target surface, consisting of a 90 degree spherical electrostatic capacitor (two electrodes shaped as concentric quarter-spheres) with variable voltages on both the inner and outer electrodes. Circular apertures are mounted at the entrance and exit of the analyzer to limit the fringing electric fields and define the beam size.

An electrostatic lens is used for focusing the beam from the electron gun into the virtual object plane of the energy analyzer. This lens is also used to collect secondary electrons or secondary ions leaving the energy analyzer and focus them into the imaging optics.

A deflector is used for steering the electron beam onto the axis of the lens. This deflector is also used to steer the secondary electrons or secondary ions into the electron/ion detector, or to steer the secondary ions into the SIMS mass filter entrance aperture.

An electron gun is used for providing a beam of electrons which is aimed towards the deflector, and then on through the lens and energy analyzer, finally ending up at the target surface.

The imaging system employed by the present invention, may include one or several elements. A channel electron multiplier may be used for detection of secondary electrons (SE) to provide an SE imaging signal. A channel electron multiplier may be used for detection of secondary ions (SI) to provide an SI imaging signal. A channel electron multiplier may be used for collection of either secondary electrons or secondary ions to provide an imaging signal. A secondary ion mass spectrometer (SIMS) system may be used for collection and mass analysis of the secondary ions collected by the energy analyzer. This provides a signal (or multiple signals) for SIMS imaging.

There are several novel features of the invention. First, charge neutralization is optimized at the target surface by flooding the target with low energy electrons incident perpendicularly to the target surface. An energy analyzer (a 90 degree spherical electrostatic capacitor) is used to deflect the charge neutralization electron beam from a horizontal direction into a vertical direction to accomplish optimized charge neutralization. The collection of secondary electrons and ions into the imaging optics is efficiently accomplished using the energy analyzer to deflect the initially vertical ion or electron trajectories into a horizontal direction, toward the various imaging signal collectors.

The present invention also permits combination of several imaging modes in a single system. A secondary electron imaging mode forms an image using secondary electrons emitted from the target surface due to bombardment by the primary ion beam. In addition, a secondary ion imaging mode forms an image using secondary ions emitted from the target surface due to bombardment by the primary ion beam. A secondary ion mass spectrometer (SIMS) mode collects secondary ions emitted from the target surface due to bombardment by the primary ion beam, then performs a mass analysis to select one or more ion species. These ion species are detected to produce the SIMS signal, which can then be used to produce mass spectra, depth profiles or elemental maps of the target.

Another element of the present invention is the use of the energy analyzer to bring the charge neutralization electron beam out through the same aperture from which the primary ion beam emerges. In addition, this same aperture is used to collect secondary electrons or ions for imaging.

There are essentially four separate beams in the system, a primary ion beam, an electron beam for charge neutralization, secondary electrons from the target, and secondary ions from the target. These four beams ar all parallel to each other in the region between the target surface and the energy analyzer entrance aperture. The energy analyzer separates the primary ion beam from the electron beam, the secondary electrons, and the secondary ions. The lens and deflector then combine to sort out the electron beam from the electron gun and to direct secondary electrons and ions to their detectors. No other instrument for mask repair, lithography, microanalysis or any other application combines all of these functions together as they are in the present invention.

This invention allows the target to be imaged with high spatial resolution even if it is a very poor electrical conductor. The performance of each of the four operating modes may be separately optimized with fewer compromises made in the overall system performance.

In particular, the electrons used to flood the target for charge neutralization are optimized in their direction (perpendicular to the target surface) and energy (0 to 150 eV). In addition, the various secondary electron and secondary ion signals are very efficiently collected over a large solid angle by the energy analyzer which is mounted directly above the target and has a circular entrance aperture surrounding the primary beam.

DETAILED DESCRIPTION OF A PREFERRED EMBODIMENT

FIGS. 1-4 describe the four operating modes of a preferred embodiment of this system. Table I provides representative operating parameters for the system shown in FIGS. 1-4 Table II provides the physical design parameters for which the operating parameters in table I are applicable.

Figure 1A:
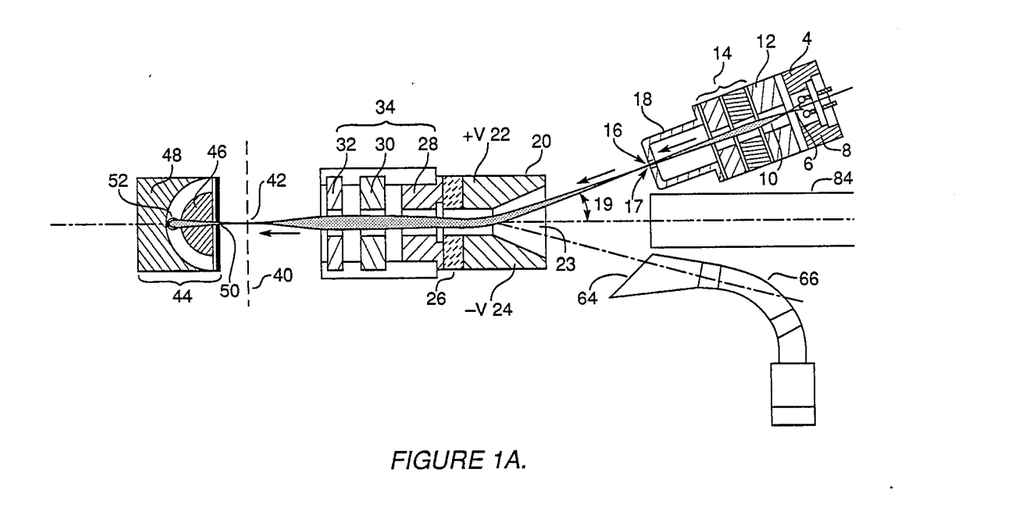
FIG. 1a is a top view of a system configured according to the present invention operating in charge neutralization mode.

FIG. 1a is a top view of the present invention 2, shown operating in the charge neutralization mode. Electron gun 4 (shown in cutaway) contains heated filament 6 mounted in housing 8. A voltage is applied between filament 6 and extraction aperture plate 12, causing electron beam 10 to be emitted from filament 6 toward extraction aperture plate 12. A portion of beam 10 passes through the central hole in extraction aperture plate 12 and into lens 14. Lens 14 focuses electron beam 10 into focus 17 at the plane of exit aperture 16 in electron gun shield 18.

Correct performance of the present invention requires the electron current to be concentrated into focus 17 in order to maximize the current which can be transported to the target. The exact design of electron gun 4 is not part of the present invention, however, to achieve focus 17 will generally require an electron gun similar in design to that shown. Principles of electron gun design are familiar to those skilled in the art.

Electron beam 10 emerges from flood gun 4 at angle 19 horizontally with respect to the axis of deflector 20. Deflector 20 (shown in cutaway) contains four electrodes, top 21 (shown in FIG. 1b), side 22, bottom 23, and side 24, in a standard quadrupole arrangement. A voltage $+V$ is applied to electrode 22 and $-V$ is applied to electrode 24. These voltages generate an electric field which deflects electron beam 10 onto the axis of deflector 20. Electrodes 21 (top—shown in FIG. 1b) and 23 (bottom) may have small positive or negative voltages to optimize steering electron beam 10. Table I gives representative values for these voltages.

Table II gives the physical design parameters for the system. The voltages and currents in Table I apply to a system with these dimensions. Systems with different dimensions would have correspondingly different requirements on their operating parameters.

TABLE I

| CHARGE NEUTRALIZATION AND IMAGING SYSTEM OPERATING PARAMETERS | | | | |
|---|---|---|---|---|
| | Operating Mode | | | |
| Parameter | C Neutral. | SE Imaging | SI Imaging | SIMS |
| Filament 6 htr | 2.6 A | 2.6 A | 2.6 A | 2.6 A |
| Filament 6 bias | −270 V | −270 V | −270 V | −270 V |
| Housing 8 | −135 V | −370 V | −370 V | −370 V |
| Extractor 12 | −135 V | −370 V | −370 V | −370 V |
| Lens 14 | −253 V | −253 V | −253 V | −253 V |
| Shield 18 | 0 V | 0 V | 0 V | 0 V |
| Electrode 21 | small* | small | small | small |
| Electrode 22 | +61 V | −45 V | +71 V | small |
| Electrode 23 | small | small | small | small |
| Electrode 24 | −61 V | +45 V | −71 V | small |
| Electrode 28 | 0 V | 0 V | 0 V | 0 V |
| Electrode 30 | −204 V | −204 V | +310 V | +284 V |
| Electrode 32 | 0 V | 0 V | 0 V | 0 V |
| Electrode 46 | +176 V | +176 V | −283 V | −283 V |
| Electrode 48 | −118 V | −118 V | +181 V | +181 V |
| Apertures 50,52 | 0 V | 0 V | 0 V | 0 V |
| Target 56 | −250 V | −250 V | +400 V | +400 V |

TABLE I-continued

CHARGE NEUTRALIZATION AND IMAGING SYSTEM OPERATING PARAMETERS

| Parameter | Operating Mode | | | |
|---|---|---|---|---|
| | C Neutral. | SE Imaging | SI Imaging | SIMS |
| Collector 64 | 0 V | 0 to 100 V | −2 to −5kV | 0 V |
| SIMS tube 84 | 0 V | 0 V | 0 V | 0 V |

*small = −15 to +15 V

TABLE II

| DESIGN Parameters | |
|---|---|
| Energy Analyzer Bottom aperture 52 | |
| diameter | 2.5 mm |
| thickness | 0.5 mm |
| distance from target | 4 mm |
| distance from bending electrodes | 1 mm |
| Energy Analyzer Side Aperture 50 | |
| diameter | 4 mm |
| thickness | 0.5 mm |
| distance from bending electrodes | 0.45 mm |
| Bending Electrodes | |
| inner bending electrode 46 radius | 7 mm |
| outer bending electrode 48 radius | 12 mm |
| Image/Virtual Object Plane 40 | |
| distance from exit aperture 50 | 10–11 mm |
| Round Lens 34 | |
| electrode 32 bore diameter | 8 mm |
| thickness | 3 mm |
| electrode 30 bore diameter | 8 mm |
| thickness | 5 mm |
| electrode 28 bore diameter | 8 mm |
| thickness | 7.25 mm |
| distance from energy analyzer side aperture to center of lens 34 | 39 mm |
| Deflector 20 | |
| bore diameter | 8 mm |
| total length | 25.4 mm |
| cone angle | 20 degrees |
| cylindrical length | 12.7 mm |
| distance from center of lens 34 to center of deflector 20 | 29 mm |
| Flood Gun 4 | |
| exit aperture diameter | 2.5 mm |
| distance along electron trajectory from flood gun exit aperture to axis | 42 mm |
| trajectory angle to axis | 20 degrees |
| SIMS Shield Tube 84 | |
| bore diameter | 7.9 mm |
| distance from deflector exit | 26 mm |
| Channeltron 66 | |
| distance along trajectory from axis to collector 64 | 36 mm |
| trajectory angle to axis | 15.3 degrees |

In the charge neutralization mode, the SIMS shield tub 84 and channeltron collector 64 must both be at 0 V, to avoid any possible deflection of electron beam 10 as it travels from exit aperture 16 to deflector 20.

The four electrodes comprising deflector 20 are mounted on insulators 26, attached to support electrode 28, which is at 0 V. Circular electrodes 28, 30 and 32 comprise electrostatic round lens 34, with electrode 32 also at 0 V. The voltage on electrode 30 determines the electric field strengths between electrodes 28 and 30, and between electrodes 30 and 32. The focal length of lens 34 depends inversely on the strengths of these two electric fields. The design of electrostatic deflectors and lenses is generally understood by those skilled in the art. The detailed design of deflector 20 and lens 34 is not part of the present invention.

Lens 34 brings electron beam 10 to a focus 42 in the energy analyzer virtual object plane 40. Energy analyzer 44 consists of inner electrode 46, outer electrode 48, side aperture 50 and bottom aperture 52. Electron beam 10 leaves focus 42 and enters side aperture 50, still moving horizontally. In the charge neutralization mode, energy analyzer 44 has a positive voltage on electrode 46 and a negative voltage on electrode 48. These voltages induce a radial electric field which bends electron beam 10 from its initially horizontal direction 90 degrees into a downward direction toward bottom aperture 52.

The relative orientation of flood gun 4, SIMS shield tube 84, and channeltron collector 64 is not part of the present invention. In alternative embodiments of the invention, either flood gun 4 or channeltron collector 64 might be on the axis of deflector 20. Possibly, no component would be exactly on the axis of deflector 20. In addition, the presence of all three of these components (flood gun 4, SIMS tube 84, and channeltron 66) is not required for the functioning of the present invention.

Figure 1B:
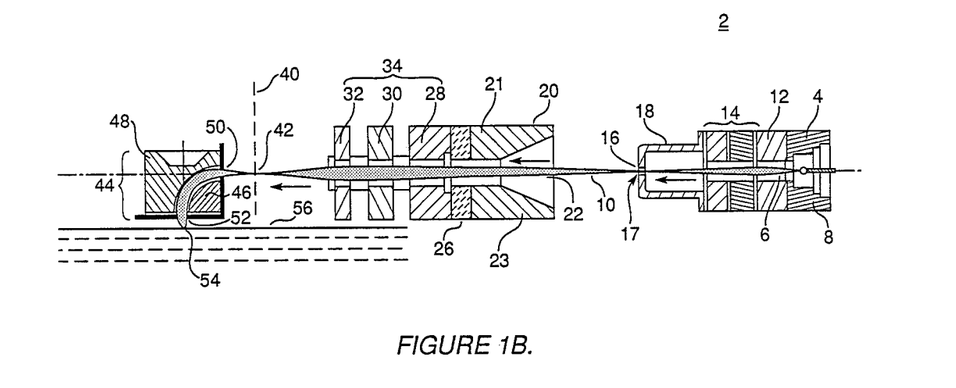
FIG. 1b is a side view of a system configured according to the present invention operating in charge neutralization mode.

FIG. 1b is a side view of the present invention 2, operating in the charge neutralization mode as in FIG. 1a. The spherically radial electric field in energy analyzer 44 forms an image 54 (at target surface 56) of focus 42. A voltage of −200 to −300 V is applied to target surface 56 relative to bottom aperture 52 (which is at 0 V) so that electron beam 10 is decelerated from its energy leaving bottom aperture 52 (200 to 300 eV) to roughly 0 to 50 eV when it reaches target surface 56 at area 54 at an angle normal to the target surface. The energy of electron beam 10 when it reaches target surface 56 is adjusted to produce the best image (i.e., lack of charging at the target surface 56). Together, the energy and angle of electron beam 10 maximize the efficiency of the charge neutralization process.

Figure 2A:
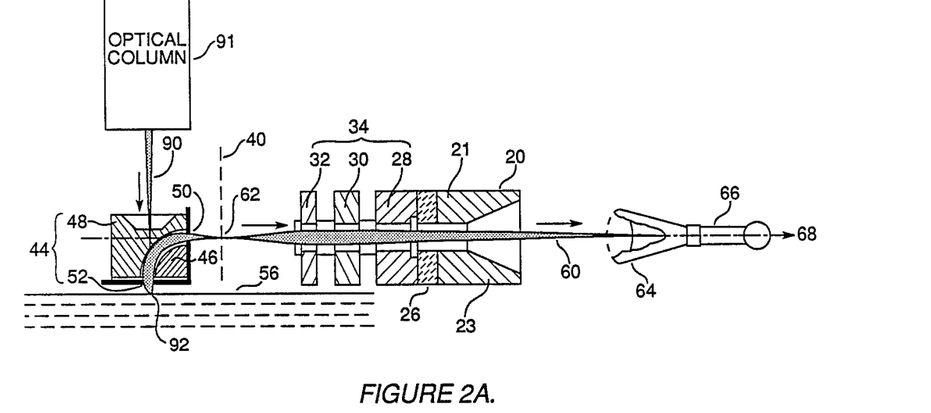
FIG. 2a is a side view of a system configured according to the present invention operating in secondary electron imaging mode.

FIG. 2a is a side view of the present invention operating in the secondary electron imaging mode. Secondary electrons are emitted from area 92 of target surface 56 due to the impact of primary ion beam 90. To achieve the best current density in ion beam 90 at the target, the final lens of the optical column 91 which produces the beam should be as close as possible to the target surface. Thus, the flood gun 4 and the imaging optics must be physically located in the small space between the final lens and the target.

The secondary electrons emerge in roughly a cosine distribution ("Lambert Law") relative to a vertical axis, thus the majority of them are concentrated near the axis of energy analyzer bottom aperture 52, the axis being perpendicular to the target surface.

Bottom aperture 52, optimally located directly above the point on the target where the primary ion beam is striking, is at 0 V, while target surface 56 is at −200 to −300 V. This induces a vertical electric field between target surface 56 and bottom aperture 52 which accelerates the initially low energy secondary electrons (0 to 50 eV) up to 200 to 350 eV when they enter bottom aperture 52. This enables efficient collection of secondary electrons since even those electrons with initial directions away from the axis are pulled up towards bottom aperture 52. The voltage on inner electrode 46 is positive and the voltage on outer electrode 48 is negative. These voltages induce a spherically radial electric field which bends secondary electron beam 60 from its initially vertical direction (entering bottom aperture 52) 90 degrees into a horizontal direction, towards side aperture 50. Energy analyzer 44 also acts as a lens, forming an image 62 (in plane 40) of are 92.

Figure 2B:
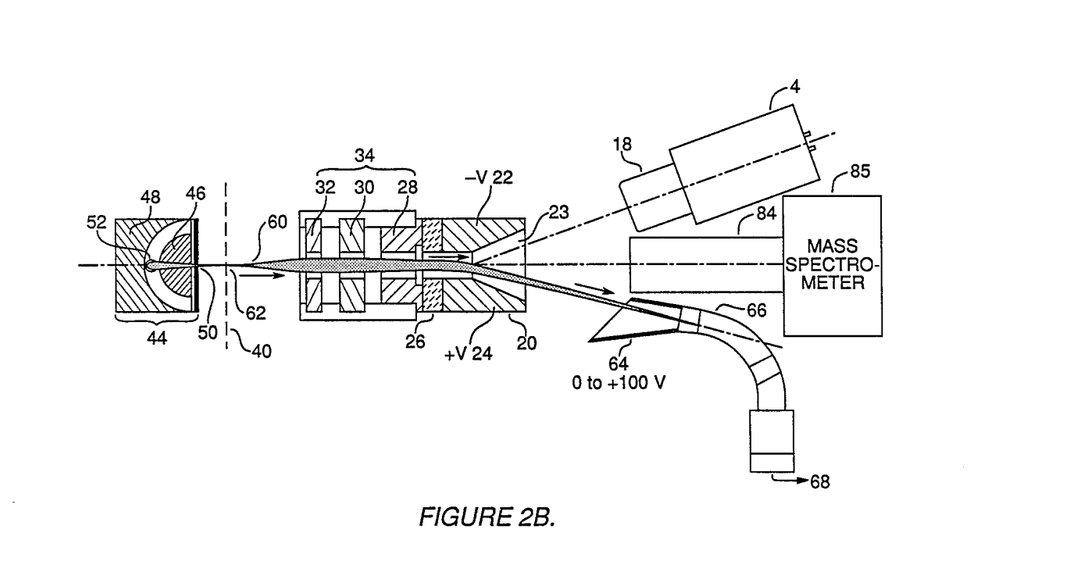
FIG. 2b is a top view of a system configured according to the present invention operating in secondary electron imaging mode.

FIG. 2b illustrates the remainder of the secondary electron imaging mode. FIG. 2b is a top view of the present invention, operating in the secondary electron imaging mode as in FIG. 2a. Secondary electron beam 60 is brought to a focus 62 in energy analyzer image plane 40. In the three imaging modes, where charged particles (electrons or ions) enter energy analyzer 44 through bottom aperture 52 and emerge from side aperture 50, the object plane is target surface 56 and the image plane is plane 40. In the charge neutralization mode, where electron beam 10 enters side aperture 50 and emerges through bottom aperture 52, the virtual object plane is plane 40 and the image plane is target surface 56.

Electrodes 28, 30 and 32 form electrostatic round lens 34, as in FIG. 1. The voltage on electrode 30 determines the electric field strengths between electrodes 32 and 30, and between 30 and 28. The focal length of lens 34 varies inversely with these field strengths. The voltage on electrode 30 is adjusted to form an image of focus 62 at collector 64 (shown in cutaway) of channel electron multiplier 66.

After passing through lens 34, electron beam 60 enters deflector 20. A negative voltage is applied to deflector electrode 22 and a positive voltage to electrode 24, as shown in Table I, inducing an electric field which deflects electron beam 60 off the axis of deflector 20 and towards CEM collector 64. Electrodes 21 (top—shown in FIG. 2a) and 23 (bottom) may have small positive or negative voltages less than 15 volts to optimize steering electron beam 60.

When electron beam 60 reaches collector 64, it enters the center channel of CEM 66, where the secondary electron signal multiplication process occurs. CEM output signal 68 goes to the imaging system, which is not shown. The function of the CEM is well understood by those skilled in the art and is not part of the present invention. CEM 66 could be replaced any other type of electron detector, such as a Faraday cup, or a scintillator-photomultiplier.

In this imaging mode, SIMS shield tube 84 and electron gun shield 18 must both be at 0 V, to avoid any possible deflection of electron beam 60 between deflector 20 and CEM collector 64. In addition, flood gun 4 must be biased to turn off its electron emission.

The secondary electron image obtained in this operating mode is relatively free of topographic detail from target surface 56, because electron beam 60 is collected straight up from the plane of the surface. Most of the image contrast is due to differences in secondary electron emission coefficients of various materials in target surface 56.

Figure 3A:
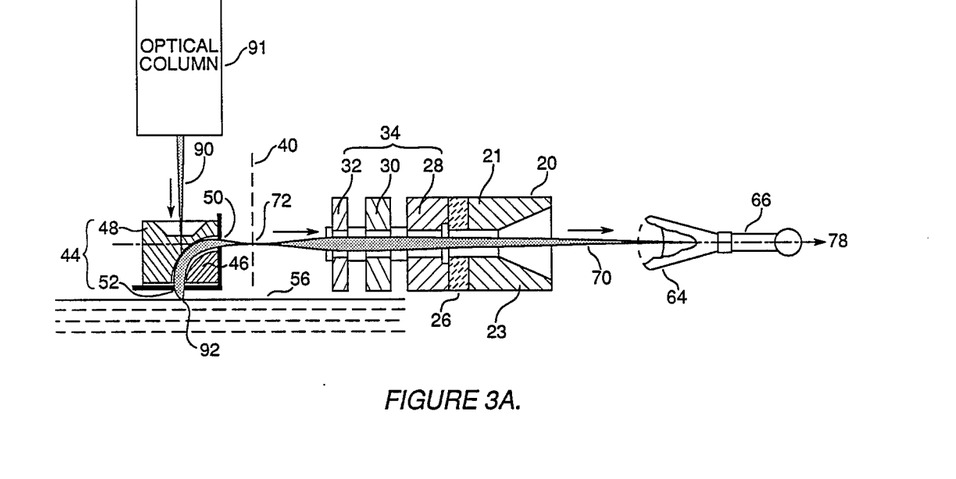
FIG. 3a is a side view of a system configured according to the present invention operating in secondary ion imaging mode.

FIG. 3a is a side view of the present invention operating in the secondary ion imaging mode. Secondary ions are emitted from area 92 of target surface 56 due to the impact of primary ion beam 90. These secondary ions emerge in roughly a cosine distribution ("Lambert Law") relative to a vertical axis, thus the majority of them are concentrated near the axis of energy analyzer bottom aperture 52 the axis being perpendicular to the target surface.

Bottom aperture 52 is at 0 V, while target surface 56 is at +200 to +500 V. This induces a vertical electric field between target surface 56 and bottom aperture 52 which accelerates the initially low energy (positive) secondary ions (0 to 50 eV) up to 200 to 550 eV when they enter bottom aperture 52. This enables efficient collection of secondary ions since even those ions with initial directions away from the axis are pulled up towards bottom aperture 52. The voltage on inner electrode 46 is negative and the voltage on outer electrode 48 is positive. These voltages induce a spherically radial electric field which bends secondary ion beam 70 from its initially vertical direction (entering bottom aperture 52) 90 degrees into a horizontal direction, towards side aperture 50. Energy analyzer 44 also acts as a lens, forming image 72 (in plane 40) of area 92.

Figure 3B:
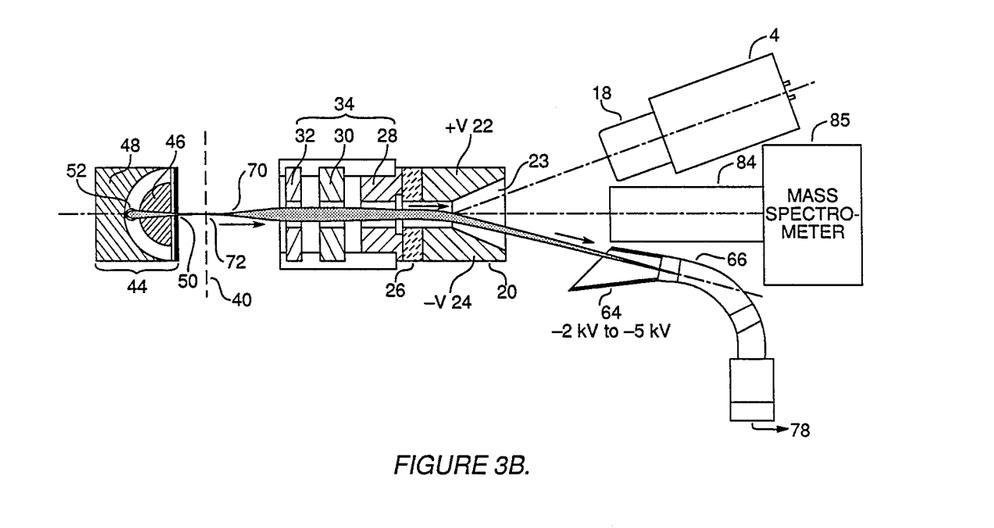
FIG. 3b is a top view of a system configured according to the present invention operating in secondary ion imaging mode.

FIG. 3b illustrates the remainder of the secondary ion imaging mode. FIG. 3b is a top view of the present invention, operating in the secondary ion imaging mode as in FIG. 3a. The energy analyzer acts as a lens to bring secondary ion beam 70 to a focus 72 in image plane 40. Area 92 on target surface 56 is the object for the energy analyzer lens.

Electrodes 28, 30 and 32 form electrostatic round lens 34, as in FIG. 1. The voltage on electrode 30 determines the electric field strengths between electrodes 32 and 30, and between 30 and 28. The focal length of lens 34 varies inversely with these field strengths. The voltage on electrode 30 is adjusted to form an image of focus 72 at collector 64 (shown in cutaway) of channel electron multiplier 66.

After passing through lens 34, ion beam 70 enters deflector 20. A positive voltage is applied to deflector electrode 22 and a negative voltage to electrode 24, inducing an electric field which deflects ion beam 70 off the axis of deflector 20 and towards collector 64. Electrodes 21 (top—shown in FIG. 3a) and 23 (bottom) may have small positive or negative voltage less than 15 volts to optimize steering ion beam 70.

CEM Collector 64 is at −2 kV to −5 kV, to accelerate secondary ion beam 70 to 2–5 keV energy when it reaches the inner surface of collector 64 as shown. This high energy is required since secondary ion beam 70 must generate a sufficient number of secondary electrons at collector 64. These secondary electrons then enter the center channel of CEM 66, where the secondary electron signal multiplication process occurs. CEM output signal 78 goes to the imaging system, which is not shown. The functioning of CEM 66 is well understood by those familiar with the art and is not part of the present invention. This CEM could be replaced any other type of ion detector, such as a Faraday cup, or a scintillator-photomultiplier.

In this imaging mode, SIMS shield tube 84 and electron gun shield 18 must both be at 0 V, to avoid any possible deflection of ion beam 70 between deflector 20 and CEM collector 64. In addition, flood gun 4 must be biased to turn off its electron emission in this mode.

The secondary ion image obtained in this mode is relatively free of topographic detail from target surface 56, because ion beam 70 is collected straight up from the plane of the surface. Most of the image contrast is due to differences in secondary ion emission coefficients of various materials in target surface 56.

Figure 4A:
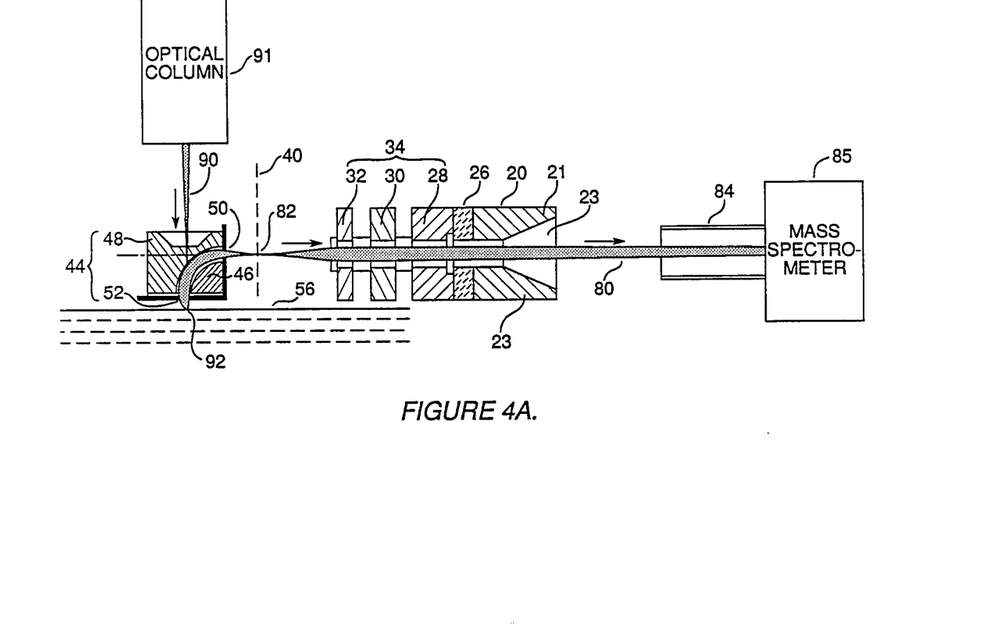
FIG. 4a is a side view of a system configured according to the present invention operating in secondary ion mass spectrometer mode.

FIG. 4a is a side view of the present invention operating in the secondary ion mass spectrometer (SIMS) mode. Secondary ions are emitted from area 92 of target surface 56 due to the impact of primary ion beam 90. These secondary ions emerge in roughly a cosine distribution ("Lambert Law") relative to a vertical axis, thus the majority of them are concentrated near the axis of energy analyzer bottom aperture 52, the axis being perpendicular to the target surface.

Bottom aperture 52 is at 0 V, while target surface 56 is at +200 to +500 V for SIMS with positive ions (−200 to −500 V for SIMS with negative ions). This induces a vertical electric field between target surface 56 and bottom aperture 52 which accelerates the initially low energy secondary ions (0 to 50 eV) up to 200 to 550 eV when they enter bottom aperture 52. This enables efficient collection of secondary ions since even those ions with initial directions away from the axis are pulled up towards bottom aperture 52. For SIMS with positive ions, the voltage on inner electrode 46 is negative and the voltage on outer electrode 48 is positive. For SIMS with negative ions, the voltage polarities are opposite. These voltages induce a spherically radial electric field which bends secondary ion beam 80 from its initially vertical direction (entering bottom aperture 52) 90 degrees into a horizontal direction, towards side aperture 50. Energy analyzer 44 also acts as a lens, forming an image 82 (in plane 40) of area 92.

Figure 4B:
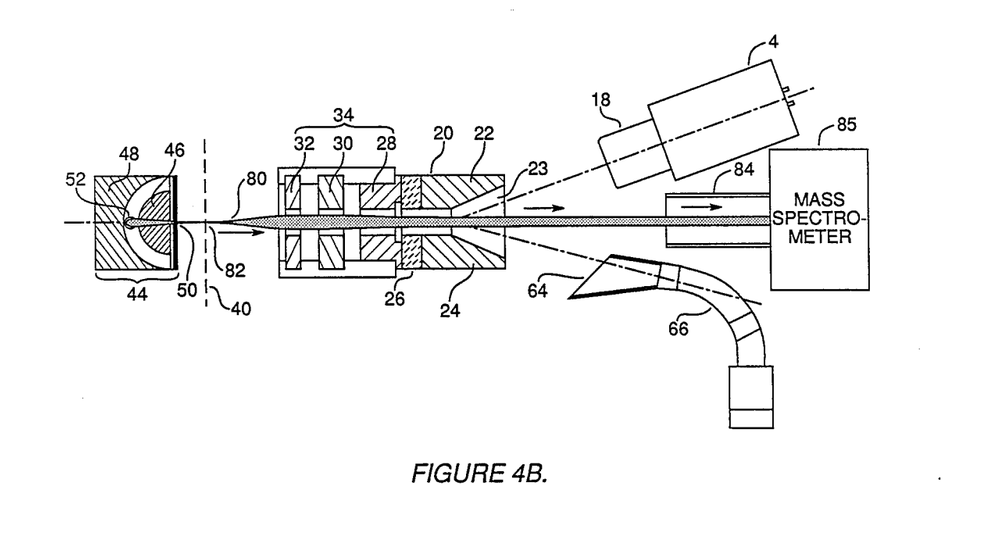
FIG. 4b is a top view of a system configured according to the present invention operating in secondary ion mass spectrometer mode.

FIG. 4b illustrates the remainder of the SIMS imaging mode. FIG. 4b is a top view of the present invention, operating in the SIMS mode as in FIG. 4a. The energy analyzer acts as a lens to bring secondary ion beam 80 to a focus 82 in image plane 40. Area 92 on target surface 56 is the object for the energy analyzer lens.

Electrodes 28, 30 and 32 form electrostatic round lens 34, as in FIG. 1. The voltage on electrode 30 determines the electric field strengths between electrodes 32 and 30, and between 30 and 28. The focal length of lens 34 varies inversely with these field strengths. The voltage on electrode 30 is adjusted to form an image of focus 82 in the mass spectrometer (not shown at the right).

After passing through lens 34, ion beam 80 enters deflector 20. Small positive or negative voltages less than 15 volts may be applied to electrodes 21 (top), 22 (side), 23 (bottom) and 24 (side) of deflector 20 in order to properly steer ion beam 80 into SIMS shield tube 84 leading to the mass spectrometer 85.

A particular embodiment of the mass spectrometer might be a Wien (crossed electric and magnetic field) filter, familiar to those skilled in the art. In this case, deflector 20 would be used to steer ion beam 80 into the Wien filter entrance aperture. Lens 34 would be adjusted to focus ion beam 80 into the plane of the Wien filter mass separation aperture. The electric and magnetic fields of the Wien filter would then be adjusted to transmit the desired ion species to the mass aperture, as is familiar to those skilled in the art. Other possibilities for the mass filter include a radio frequency quadrupole or a magnetic spectrometer. The particular choice of mass filter is not part of the present invention.

What is claimed is:

1. A focused ion beam system having alternating modes wherein, in a first, imaging mode, a primary ion beam is scanned in a predetermined pattern across the surface of a target thereby stimulating emission of secondary particles used for imaging said target and, in a second, charge neutralization mode, electrons are directed to said surface for neutralizing charge accumulated during said first mode, and comprising:
   means for providing said primary ion beam and focusing said ion beam at and orthogonally to said target surface in said first mode;
   means for controlling the voltage on said target surface;
   means for providing an electron beam in said second mode;
   an energy analyzer positioned directly above said target surface and including a ninety degree spherical electrostatic capacitor for directing secondary particles horizontally onto a horizontal axis in said first mode and for directing said electron beam vertically onto said target surface in the second mode, said capacitor having a vertical aperture through the outer electrode thereof for allowing transmission of said primary ion beam in said first mode;
   imaging detector means for collecting said secondary particles in said first mode;
   an electrostatic lens on said horizontal axis for focusing said secondary particles into said imaging detector means in said first mode, and said electron beam into the image plane of said energy analyzer in said second mode; and
   an electrostatic deflector on said horizontal axis for directing said secondary particles into said imaging detector means in said first mode and for directing said electron beam onto the axis of said electrostatic lens in said second mode.

2. The apparatus according to claim 1 wherein said secondary particles are secondary electrons and means are provided for supplying, during said first mode, voltages to said target surface, said energy analyzer, said electrostatic lens, and said electrostatic deflector for enabling said secondary electrons to be directed to said imaging detector means.

3. The apparatus according to claim 2 wherein said imaging detector means for said secondary electrons comprises a channel electron multiplier.

4. The apparatus according to claim 2 wherein said imaging detector means for said secondary electrons comprises a Faraday cup.

5. The apparatus according to claim 2 wherein said imaging detector means for said secondary electrons comprises a scintillator-photomultiplier combination.

6. The apparatus according to claim 1 wherein said secondary particles are secondary ions and means are provided for supplying, during said first mode, voltages to said target surface, said energy analyzer, said electrostatic lens, and said electrostatic deflector for enabling said secondary ions to be directed to said imaging detector means.

7. The apparatus according to claim 6 wherein said detector means for said secondary ions comprises a channel electron multiplier.

8. The apparatus according to claim 6 wherein said detector for said secondary ions comprises a Faraday cup.

9. The apparatus according to claim 6 wherein said detector means for said secondary ions comprises a scintillator-photomultiplier combination.

10. The apparatus according to claim 6 wherein said detector means for said secondary ions comprises a secondary ion mass spectrometer.

11. The apparatus according to claim 10 wherein said secondary ion mass spectrometer is a radio frequency quadrupole.

12. The apparatus according to claim 10 wherein said secondary ion mass spectrometer is a Wien filter.

13. The apparatus according to claim 1 wherein said electrostatic deflector is an electrostatic quadrupole.

14. The apparatus according to claim 1 wherein said electrostatic lens is an einzel lens with both outer electrodes grounded.

15. The apparatus according to claim 1 wherein said electrostatic energy analyzer is mounted within a grounded enclosure.

16. The apparatus according to claim 15 wherein the bottom said grounded enclosure has a circular aperture aligned with the bottom of said vertical aperture of said energy analyzer, said enclosure aperture allowing passage of said electron beam towards said target surface in said second mode and passage of said secondary particles into said energy analyzer in said first mode.

17. The apparatus according to claim 15 wherein a side of said grounded enclosure has a circular aperture aligned with the axes of said electrostatic lens and said electrostatic deflector, said aperture allowing passage of said electron beam into said energy analyzer in said second mode and passage of said secondary particles into said electrostatic lens in said first mode.

18. A focused ion beam system having alternating modes wherein, in a first, imaging mode, a primary ion beam is scanned in a predetermined pattern across the surface of a target thereby stimulating emission of secondary particles used for imaging said target and, in a second, charge neutralization mode, electrons are directed to said surface for neutralizing charge accumulated during said first mode, and comprising:

means for providing said primary ion beam and focusing said ion beam at and orthogonally to said target surface in said first mode;

means for controlling the voltage on said target surface;

means for providing an electron beam in said second mode;

an energy analyzer positioned directly above said target surface and including a ninety degree spherical electrostatic capacitor for directing secondary particles horizontally onto a horizontal axis in s id first mode and for directing said electron beam vertically onto said target surface in the second mode, said capacitor having a vertical aperture through in the outer electrode thereof for allowing transmission of said primary ion beam in said first mode;

imaging detector means comprising a channel electron multiplier and a secondary ion mass spectrometer for collecting said secondary particles in said first mode;

an electrostatic einzel lens on said horizontal axis for focusing said secondary particles into said imaging detector means in said first mode, and said electron beam into the image plane of said energy analyzer in said second mode; and an electrostatic quadrupole deflector on said horizontal axis for directing said secondary particles into said imaging detector means in said first mode and for directing said electron beam onto the axis of said electrostatic lens in said second mode.

19. The apparatus according to claim 18 wherein said secondary ion mass spectrometer comprises a Wien filter.

20. The apparatus according to claim 18 wherein said secondary ion mass spectrometer comprises a radio frequency quadrupole.

21. A method of imaging a target in a focused ion beam system comprising the steps of:

providing an evacuated enclosure containing an ion column for providing a primary ion beam, an electron gun and a target stage for positioning said target under said column;

scanning the surface of said target in a predetermined pattern with said primary ion beam for a first predetermined period of time;

collecting secondary particles emitted from said target surface around a vertical axis under impact of said primary ion beam;

deflecting said secondary particles onto a horizontal axis using an energy analyzer comprised of a ninety degree spherical electrostatic capacitor, said secondary particles passing through said energy analyzer in a first direction;

focusing and deflecting said secondary particles into an imaging detector:

after said first predetermined period of time, blanking said primary ion beam off and enabling said electron gun to generate an electron beam;

focusing and deflecting said electron beam into said energy analyzer in a second direction;

deflecting said electron beam downward onto said target surface along said vertical axis using said energy analyzer; and after a second predetermined period of time, disabling said electron gun and unblanking said primary ion beam.

22. The method according to claim 21 wherein said evacuated enclosure contains said energy analyzer, an electrostatic lens, an electrostatic deflector, and said imaging detector, and further including the steps of:

at the beginning of said first predetermined period of time, adjusting the voltages on said analyzer, said lens, said deflector, and said imaging detector for transporting said secondary particles to said imaging detector and at the beginning of said second predetermined period of time, adjusting the voltages of said analyzer, said lens, said deflector, and said imaging detector for transporting said electron beam to said target surface.

* * * * *